United States Patent
Iqbal

(10) Patent No.: US 12,028,067 B2
(45) Date of Patent: Jul. 2, 2024

(54) COMPLEMENTARY 2(N)-BIT REDUNDANCY FOR SINGLE EVENT UPSET PREVENTION

(71) Applicant: Google LLC, Mountain View, CA (US)

(72) Inventor: Syed Shakir Iqbal, Bangalore (IN)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/757,926

(22) PCT Filed: Jun. 21, 2021

(86) PCT No.: PCT/US2021/038250
§ 371 (c)(1),
(2) Date: Jun. 23, 2022

(87) PCT Pub. No.: WO2022/271144
PCT Pub. Date: Dec. 29, 2022

(65) Prior Publication Data
US 2024/0171179 A1      May 23, 2024

(51) Int. Cl.
*H03K 19/23*      (2006.01)
*H03K 19/003*      (2006.01)

(52) U.S. Cl.
CPC ........... *H03K 19/23* (2013.01); *H03K 19/003* (2013.01)

(58) Field of Classification Search
None
See application file for complete search history.

(56) References Cited

U.S. PATENT DOCUMENTS

| | | | |
|---|---|---|---|
| 6,127,864 A | * | 10/2000 | Mavis ................. H03K 3/0375 327/295 |
| 6,253,348 B1 | | 6/2001 | Davidsson et al. |
| 6,275,080 B1 | | 8/2001 | Phan et al. |
| 6,504,411 B2 | | 1/2003 | Cartagena |
| 7,142,004 B2 | | 11/2006 | Carlson |
| 8,489,919 B2 | | 7/2013 | Clark et al. |
| 8,975,913 B2 | | 3/2015 | Smith |
| 11,296,700 B1 | * | 4/2022 | Rao ...................... H03K 3/0372 |

(Continued)

FOREIGN PATENT DOCUMENTS

TW      201516682 A      5/2015

OTHER PUBLICATIONS

"International Search Report and Written Opinion", Application No. PCT/US2021/038250, Apr. 5, 2022, 11 pages.

(Continued)

*Primary Examiner* — Jany Richardson
(74) *Attorney, Agent, or Firm* — Colby Nipper PLLC

(57) ABSTRACT

The present disclosure describes various aspects of complementary 2(N)-bit redundancy for single event upset (SEU) prevention. In some aspects, an integrated circuit includes a data storage element to store a data value, another data storage element to store a complementary data value, a multi-bit data storage element (e.g., a 2-bit storage element) to store both the data value and the complementary data value, and voting logic that may enable a complementary data storage scheme with inter-circuit redundancy to prevent SEU. Additionally, the voting logic of the integrated circuit may enable detection and correction of data value errors and/or enable programming of voting logic criteria, which may be implemented dynamically based on a type of SEU failures that are detected or corrected.

20 Claims, 8 Drawing Sheets

(56) References Cited

U.S. PATENT DOCUMENTS

| | | | |
|---|---|---|---|
| 2008/0258792 A1 | 10/2008 | Carlson et al. | |
| 2009/0204933 A1* | 8/2009 | Rezgui | H03K 19/0033 |
| | | | 716/122 |
| 2010/0026338 A1* | 2/2010 | Fulcomer | H03K 19/00338 |
| | | | 326/11 |
| 2016/0254803 A1 | 9/2016 | Kanno et al. | |
| 2020/0111786 A1 | 4/2020 | Whitaker et al. | |

OTHER PUBLICATIONS

Qi, et al., "Low Cost and Highly Reliable Radiation Hardened Latch Design in 65 nm CMOS Technology", May 1, 2015, 10 pages.
"International Preliminary Report on Patentability", Application No. PCT/US2021/038250, Dec. 14, 2023, 7 pages.
"Foreign Office Action", TW Application No. 111138221, Feb. 15, 2024, 7 pages.

\* cited by examiner

500

```
┌─────────────────────────────────────────────────────────────┐
│  Monitor a complementary pair of a data value from a first  │
│  register and a complementary data value from a second register │
│                            502                               │
└─────────────────────────────────────────────────────────────┘
                              │
                              ▼
┌─────────────────────────────────────────────────────────────┐
│  Detect a failure of the first register or the second register based on │
│  respective values of the data value and the complementary data value │
│                            504                               │
└─────────────────────────────────────────────────────────────┘
                              │
                              ▼
┌─────────────────────────────────────────────────────────────┐
│  Alter voting logic to exclude the first register or the second register │
│  from voting criteria that is used to provide an output data value │
│                            506                               │
└─────────────────────────────────────────────────────────────┘
                              │
                              ▼
┌─────────────────────────────────────────────────────────────┐
│  Alter the voting logic to include a data value or           │
│  complementary data value from a third register in the voting criteria │
│                            508                               │
└─────────────────────────────────────────────────────────────┘
                              │
                              ▼
┌─────────────────────────────────────────────────────────────┐
│  Generate the output data value using the altered voting logic based │
│  on at least one data value from the complementary pair and the data │
│  value or the complementary data value from the third register │
│                            510                               │
└─────────────────────────────────────────────────────────────┘
```

FIG. 5

COMPLEMENTARY 2(N)-BIT REDUNDANCY FOR SINGLE EVENT UPSET PREVENTION

RELATED APPLICATION(S)

This application is a national stage entry of International Application No. PCT/US2021/038250, filed Jun. 21, 2021, the disclosure of which is incorporated herein by reference in its entirety.

BACKGROUND

Without protective measures, integrated circuits are often vulnerable in certain environmental conditions, such as when exposed to solar radiation. For example, charged solar particles may strike a node of an integrated circuit, thereby causing a sudden spike in voltage. This phenomenon is known as a single event transient (SET). When an SET occurs at or propagates to a register input during a setup/hold window of a latch circuit, there is a risk of the SET being captured by the circuitry. When the SET is captured by the latch circuit, the SET results in a single event upset (SEU) that can affect an output value of the latch circuit. As such, SEUs may cause major malfunctions by producing errors in nodes of a logic element by changing a bit value from an intended "1" value to an incorrect "0" value or from an intended "0" value to an incorrect "1" value. These circuit-level errors can adversely affect the operation of many types of secure or mission-critical devices, including airplanes, voting machines, medical devices, satellites, and so on. Accordingly, minimizing SEU vulnerabilities of circuits and associated issues that can affect operation of various types of electronic devices is of great consequence.

Preceding techniques of SEU prevention attempt to reduce the likelihood of an SEU by creating hardware redundancies within the integrated circuit. These redundant elements are segregated by a technology-specific distance to offset the risk of a naturally occurring SEU affecting all of the redundant elements. For example, triple modular redundancy (TMR) replicates each critical latch/flop, requiring SEU tolerance compliance three times. These redundancies, however, do not address inherent vulnerabilities to deliberate attacks. Such an attack can be easily executed when the attacker knows an approximate distance between the redundant circuit elements, and since the redundant elements are identical, an effective attack on one will be effective on the others. Thus, the preceding techniques of SEU prevention may not be sufficient to defend against malicious actors or SETs that occur under other circumstances.

SUMMARY

This disclosure describes apparatuses of and techniques for complementary 2(N)-bit redundancy for single event upset (SEU) prevention. In some aspects, an integrated circuit includes a data storage element to store a data value, another data storage element to store a complementary data value, a multi-bit data storage element (e.g., a 2-bit storage element) to store both the data value and the complementary data value, and voting logic that may enable a complementary data storage scheme with inter-circuit redundancy to prevent SEU. Additionally, the voting logic of the integrated circuit may enable detection and correction of data value errors and/or enable programming of voting logic criteria, which may be implemented dynamically based on a type of SEU failures that are detected or corrected.

In some aspects, an integrated circuit for complementary 2(N)-bit redundancy for SEU prevention comprises an input node to receive a data value and a first data storage element having an input operably coupled to the input node, the first data storage element configured to store the data value. The integrated circuit also includes at least one inverter operably coupled to the input node to provide a complementary data value and a second data storage element having an input operably coupled to the at least one inverter, the second data storage element configured to store the complementary data value. A multi-bit data storage element of the integrated circuit has a first input operably coupled to the input node and a second input operably coupled to the at least one inverter. The multi-bit data storage element is configured to store the data value and the complementary data value as separate values. The integrated circuit includes voter logic with an output coupled to an output node of the integrated circuit and a first input operably coupled to an output of the first data storage element to receive a first logic value based on the data value stored by the first data storage element. The voting logic also includes a second input operably coupled to an output of the second data storage element to receive a second logic value based on the complementary data value stored by the second data storage element, a third input coupled to a first output of the multi-bit data storage element to receive a third logic value based on the data value stored by the multi-bit data storage element, and a fourth input coupled to a second output of the multi-bit data storage element to receive a fourth logic value based on the complementary data value stored by the multi-bit data storage element. In aspects, the voter logic is configured to provide an output data value to the output node of the integrated circuit based on a set of respective logic values of at least three of the first logic value, second logic value, third logic value, and the fourth logic value. By so doing, the integrated circuit may implement complementary 2(N)-bit redundancy in accordance with one or more aspects, which may prevent an SEU or other related errors from affecting data stored by the circuit.

The details of one or more implementations of complementary 2(N)-bit redundancy for SEU prevention are set forth in the accompanying drawings and the following description. Other features and advantages will be apparent from the description and drawings, and from the claims. This Summary is provided to introduce subject matter that is further described in the Detailed Description and Drawings. Accordingly, this Summary should not be considered to describe essential features nor used to limit the scope of the subject matter of the appended claims.

BRIEF DESCRIPTION OF THE DRAWINGS

This disclosure describes apparatuses and techniques of complementary 2(N)-bit redundancy for SEU prevention with reference to the following drawings:

FIG. 5 illustrates an example method for error detection and/or correction that a complementary 2(N)-bit redundancy circuit can implement;

The use of same or similar reference numbers throughout the description and the figures may indicate like features or components.

DETAILED DESCRIPTION

Figure 1:
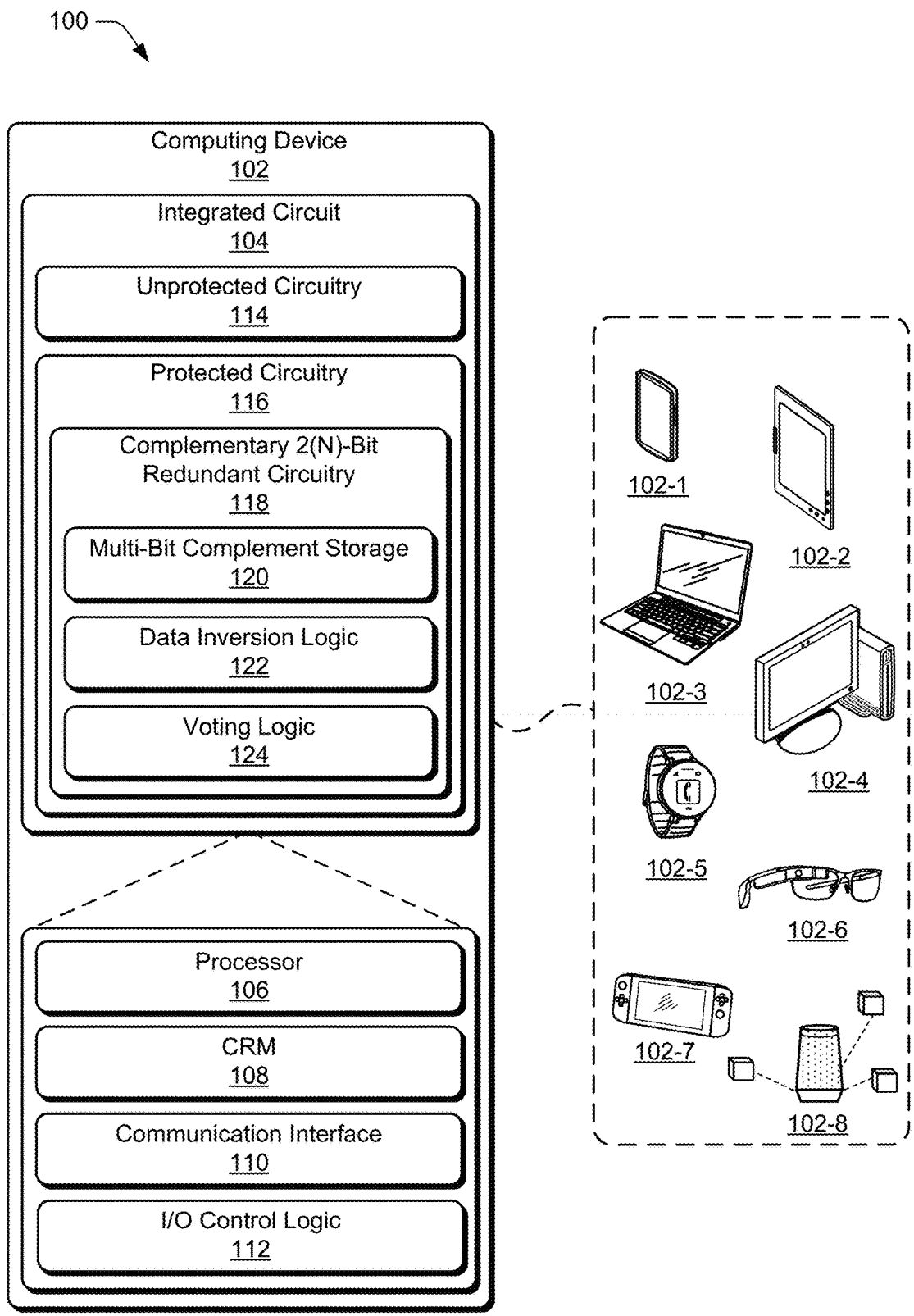
FIG. 1 illustrates an example operating environment that includes a computing device with circuitry implemented in accordance with one or more aspects of complementary 2(N)-bit redundancy for SEU prevention.

Preceding techniques of addressing single event upsets (SEUs) typically attempt to reduce the likelihood of an SEU by creating hardware redundancies within the integrated circuit. These redundant elements are segregated by a technology-specific distance to offset the risk of a naturally occurring SEU affecting all of the redundant elements. For example, triple modular redundancy (TMR) replicates each critical latch/flop, requiring SEU tolerance compliance three times. These redundancies, however, do not address inherent vulnerabilities to deliberate attacks. Such an attack can be easily executed when the attacker knows an approximate distance between the redundant circuit elements, and since the redundant elements are identical, an effective attack on one will be effective on the others. Thus, the preceding techniques of SEU prevention may not be sufficient to defend against malicious actors or single event transients (SETs) that occur under other circumstances.

In contrast with the preceding techniques, the present disclosure describes aspects of complementary 2(N)-bit redundancy to prevent single event upset (SEU). In the described aspects, circuits of a computing device may be configured to control or minimize replication of vulnerability due to a stored state by storing complementary logic states in replicated cells. The described data storage element may be implemented as a single latch, master-slave flip-flop register, or a circuit that can store data, such that the data is stored as complimentary values in a single cell to avoid attack precision. As an example, consider a circuit implemented in accordance with aspects of complementary 2(N)-bit redundancy that includes a first register configured to store a complementary value (R2) and a second register configured to store an original data value (R1). In other words, these registers store different values or have different voltages, and consequently, corresponding node values are also different and have complementary vulnerabilities. Thus, an SEU is unlikely to occur at both replicated register cells that results in both of voltages R1 and R2 changing states. As such, a malicious actor is unlikely to be able to cause an SEU because an output of the circuit will not be affected unless the malicious actor is able to change the respective states of both R1 and R2 to their complementary states. Additionally, the circuit may include voting logic that is configurable to enable voting functionality from one or more of the complementary logic paths (e.g., R1B and/or R2B). As described herein, aspects of complementary 2(N)-bit redundancy may prevent an SEU from affecting data stored by the replicated cells of the circuit and may also enable error detection and/or reconfigurable voting logic to address the detected errors.

In some aspects, an integrated circuit for complementary 2(N)-bit redundancy for SEU prevention comprises an input node to receive a data value and a first register having an input operably coupled to the input node, the first register configured to store the data value. The integrated circuit also includes at least one inverter operably coupled to the input node to provide a complementary data value and a second register having an input operably coupled to the at least one inverter, the second register configured to store the complementary data value. The complementary data value may be an inverted version of the data value. The input of the second register may be coupled to an output the at least one inverter. A multi-bit register of the integrated circuit has a first input operably coupled to the input node and a second input operably coupled to the at least one inverter (e.g., an output of the at least one inverter). The multi-bit register is configured to store the data value and the complementary data value as separate values. The integrated circuit includes voter logic with an output coupled to an output node of the integrated circuit and a first input operably coupled to an output of the first register to receive a first logic value based on the data value stored by the first register. The voting logic also includes a second input operably coupled to an output of the second register to receive a second logic value based on the complementary data value stored by the second register, a third input coupled to a first output of the multi-bit register to receive a third logic value based on the data value stored by the multi-bit register, and a fourth input coupled to a second output of the multi-bit register to receive a fourth logic value based on the complementary data value stored by the multi-bit register. In aspects, the voter logic is configured to provide an output data value to the output node of the integrated circuit based on a set of respective logic values of at least three of the first logic value, second logic value, third logic value, and the fourth logic value. By so doing, the integrated circuit may implement complementary 2(N)-bit redundancy in accordance with one or more aspects, which may prevent an SEU or other related errors from affecting data stored by the circuit. These are but a few examples of complementary 2(N)-bit redundancy for SEU prevention, other of which are described throughout the disclosure.

The following discussion describes an operating environment, techniques that may be employed in the operating environment, and various devices or systems in which components of the operating environment can be embodied. In the context of the present disclosure, reference is made to the operating environment by way of example only.

Example Environment

FIG. 1 illustrates at 100 a computing device 102 in which aspects of complementary 2(N)-bit redundancy for SEU prevention can be implemented. The computing device 102 may include additional components and interfaces omitted from FIG. 1 for the sake of clarity. As shown in FIG. 1, the computing device 102 can be implemented as a variety of consumer electronic devices. As non-limiting examples, the computing device 102 can be a mobile phone 102-1, a tablet device 102-2, a laptop computer 102-3, a desktop computer 102-4, a computerized watch 102-5, a wearable computer 102-6, a video game console 102-7, or a voice-assistant system 102-8. Although illustrated, the computing device 102 may also be implemented as other types of systems or devices, which may include any of a health monitoring device, multimedia dongle, set-top box, vehicle-based computing system, navigation device, aviation computing system, home automation device, security system controller, or the like. Note that the computing device can be wearable, non-wearable but mobile, or relatively immobile (e.g., a broadband router, mobile hotspot, or smart-appliance).

As shown in FIG. 1, the computing device 102 includes at least one integrated circuit 104 that enables one or more functionalities of the computing device. In this example, the integrated circuit 104 may be implemented as or a part of a processor 106, computer-readable storage media 108, a communication interface 110, and/or input/output (I/O) control logic 112 of the computing device 102. Although not shown, the integrated circuit 104 may be implemented as or include other components, including communication units (e.g., modems), input/output controllers, and system interfaces of the computing device 102.

The processor 106 may be implemented as a general-purpose processor (e.g., of a multicore central processing unit (CPU) or application processor (AP)), an application-specific integrated circuit (ASIC), or a system-on-chip (SoC) with other components of the computing device 102 integrated therein. The computer-readable storage media 108 can include any suitable type of memory media or storage media, such as read-only memory (ROM), programmable ROM (PROM), random access memory (RAM), dynamic RAM (DRAM), static RAM (SRAM), or Flash memory. In the context of this discussion, the computer-readable media 108 of the computing device 102 is implemented as at least one hardware-based or physical storage device, which does not include transitory signals or carrier waves. Applications, firmware, and/or an operating system (not shown) of the computing device 102 can be embodied on the computer-readable media 108 as processor-executable instructions, which may be executed by the processor 106 to provide various functionalities described herein. The computer-readable media 108 may also store information and data, such as user data or user media that is accessible through the applications, firmware, or operating system of the computing device 102.

The communication interface 110 enables wired and/or wireless communication of device data, such as received data, transmitted data, or other information as described herein. Example communication interfaces 110 include wireless personal-area-network (WPAN) radios compliant with various IEEE 802.15 standards, wireless local area network (WLAN) radios compliant with any of the various IEEE 802.11 standards, wireless wide area network (WWAN, e.g., 3GPP-compliant) radios for cellular telephony, wireless metropolitan area network (WMAN) radios compliant with various IEEE 802.16 standards, and wired local area network (LAN) Ethernet transceivers. The I/O control logic may be configured as one or more data input/output ports (data I/O ports) through which any type of data, media content, and/or other inputs can be received, such as user-selectable inputs, messages, applications, music, television content, recorded video content, and any other type of audio, video, and/or image data received from any content and/or data source. In aspects, the integrated circuit 104 and components thereof may be implemented as or part of any suitable circuit of the computing device 102, including the processor 106, computer-readable storage media 108 (CRM 108), communication interface 110, or I/O control logic 112.

The integrated circuit 104 may include, as non-limiting examples, a system-on-chip (SoC), a central processing unit, a graphics processing unit, an ASIC, a field-programmable gate array (FPGA), a media controller, a memory controller, a tensor processing unit, or any other hardware circuit that includes data storage capabilities. In this example, the integrated circuit 104 includes unprotected circuitry 114 and protected circuitry 116 that includes complementary 2(N)-bit redundant circuitry 118. In aspects, the protected circuitry 116 of the integrated circuit 104 provides some level of fault prevention or fault tolerance, such as protection from SETs or SEUs, to increase a reliability of digital systems implemented within and by the integrated circuit 104. The unprotected circuitry 114 of the integrated circuit 104 may include other circuitry of the integrated circuit 104 that does not offer or provide fault prevention or fault tolerance. As such, critical or sensitive electronic circuitry of the integrated circuit 104 may be implemented as part of the protected circuitry 116 and in accordance with one or more aspects of complementary 2(N)-bit redundancy for SEU prevention.

In the example of FIG. 1, the protected circuitry 116 includes an instance of complementary 2(N)-bit redundant circuitry 118 that is implemented with a multi-bit complement storage 120, data inversion logic 122, and voting logic 124. The multi-bit complement storage 120 may include a two-bit register (e.g., a pair of dual interlocked cell (DICE) flops) or latch circuit that receives and stores a data value and a complemented data value. The data inversion logic 122 includes any suitable type of inverting logic, inverting node, or inverting gate to provide a complemented (e.g., inverted) data value (e.g., 0) based on a data value input (e.g., 1). In aspects, the voting logic 124 is operably coupled to the multi-bit complement storage 120, an uncomplemented storage element, and a one-bit complement storage element. As described herein, a storage element may include one or more of a latch, bi-stable latch, set-reset latch (SR latch), master-slave latch. D latch, flip-flop. D flip-flop. T-flip-flop. JK flip-flop, master-slave flip-flop, one-bit register, multi-bit register, data storage circuit, a logic storage unit, a charge storage unit, or the like. Generally, the voting logic 124 is configurable to provide an output data value based on at least three input data values from the multi-bit complement storage 120, uncomplemented storage element, and one-bit complement storage element. The voting logic 124 can be configured at one or more life cycle states, such as during fabrication (e.g., physical hard coding), manufacturing (e.g., fuse programming), or in the field (e.g., self-correcting logic alterations). As described herein, the multi-bit complement storage 120, data inversion logic 122, and voting logic 124 may be implemented in a variety of ways to prevent an SEU from affecting data stored by the complementary 2(N)-bit redundant circuitry 118.

Figure 2:
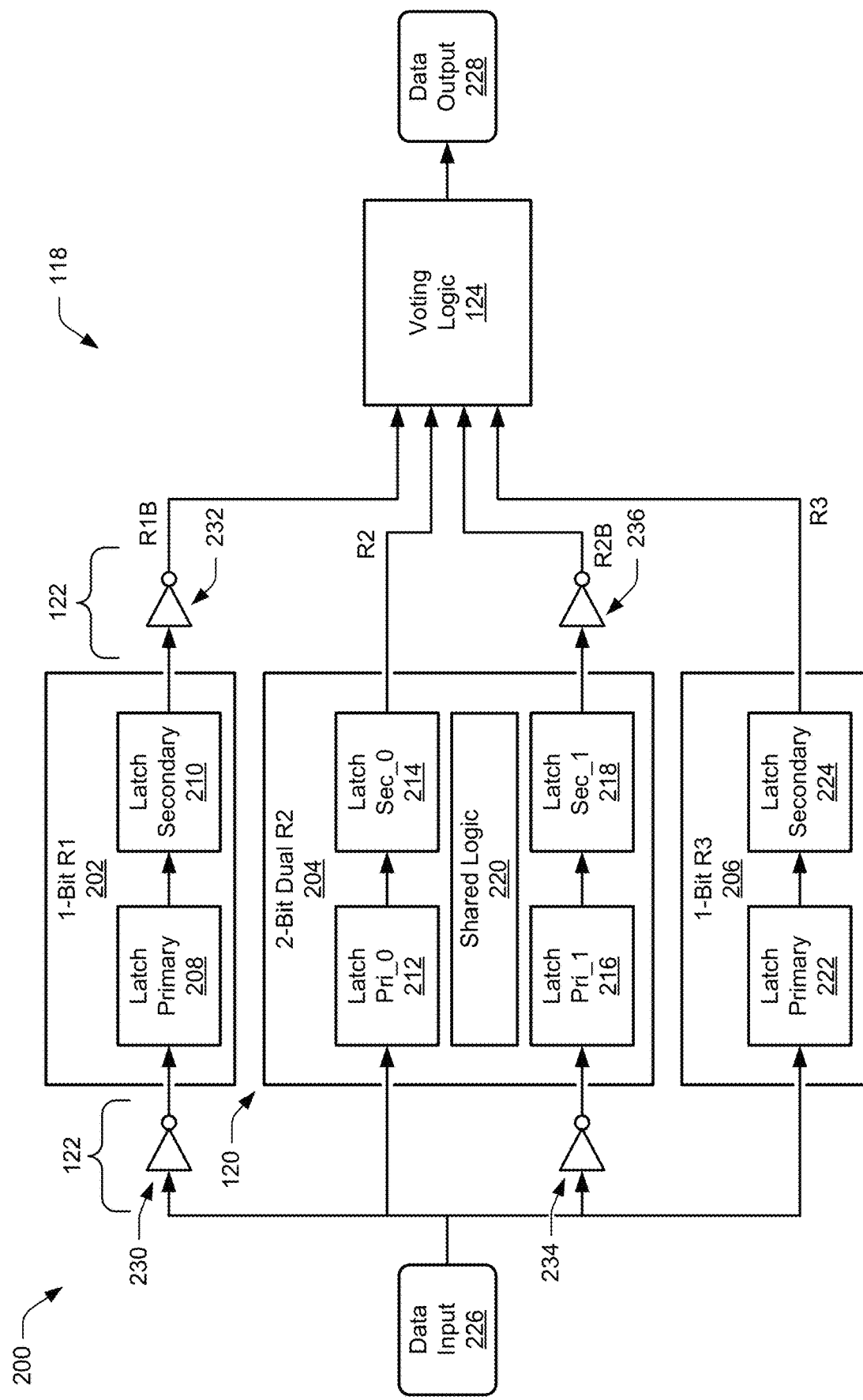
FIG. 2 illustrates an example configuration of a complementary 2(N)-bit redundancy circuit for SEU prevention.

FIG. 2 illustrates at 200 an example configuration of complementary 2(N)-bit redundant circuitry 118 and components capable of implementing aspects of complementary 2(N)-bit redundancy for SEU prevention. The illustrated components and architecture of FIG. 2 and FIG. 3 that follow are presented as non-limiting examples of ways in which complementary 2(N)-bit redundancy for SEU prevention can be implemented. As such, the aspects described herein may be applied or extended to any suitable data storage circuit to implement various features of complementary 2(N)-bit redundancy for SEU prevention. Further, any coupling or connection between various components may be direct or indirect, such as made through one or more intervening components. For visual brevity and/or clarity, some unrelated or redundant components (e.g., logic gates or complementary data paths) or circuitry may also be omitted from this or other circuit diagrams. Such an omission is not to be construed as limiting, but rather as one example of the many ways in which various aspects of the described circuitry may be used or applied to implement complementary 2(N)-bit redundancy for SEU prevention. In other words, the aspects (e.g., circuitry) described herein may also be implemented with any suitable number or combination of logic gates, data paths, and/or additional or separate redundant or replicated cells.

In aspects, the complementary 2(N)-bit redundant circuitry 118 may be implemented as shown in FIG. 2, which illustrates a multi-register redundant storage module with an option for a two-stage or three-stage voting logic 124. In this example, the complementary 2(N)-bit redundant circuitry 118 includes a first one-bit R1 register 202, a second dual two-bit register R2 204 as an instance of multi-bit complement storage 120, and a third one-bit register R3 206, which are implemented with respective latch circuits (e.g., set-reset flip-flops) to store data values. In aspects, any data storage element (e.g., one-bit or two-bit storage element), including R1, R2, and/or R3 may be implemented as a latch (e.g. single latch), bi-stable latch, set-reset latch (SR latch), master-slave latch. D latch, flip-flop. D flip-flop. T-flip-flop. JK flip-flop, master-slave flip-flop, one-bit register, multi-bit register, data storage circuit, or the like. As such, aspects described herein may apply to R1, R2, or R3 when implemented as alternative data storage elements (e.g., single latches or other types of flip-flops) from those shown and described with reference to FIG. 2. The first R1 register 202 includes a primary latch 208 (e.g., a master latch) and a secondary latch 210, and is configured to store a complemented data value (R1B). The second R2 register includes a first latch circuit with a primary latch 212 (e.g., a master latch) and a secondary latch 214, and is configured to store an original or un-complemented data value (R2). A second latch circuit of the R2 register 204 includes a primary latch 216 (e.g., a master latch) and a secondary latch 218, and is configured to store a complemented data value (R2B). In aspects, the R2 register 204 include shared logic 220 by which the first and second latch circuits operate using common clocking and gating signaling. The third R3 register 206 includes a primary latch 222 (e.g., a master latch) and a secondary latch 224, and is configured to store an original data value or un-complemented bit value. Respective inputs of the registers 202, 204, and 206 can be coupled to a data input 226 of the complementary 2(N)-bit redundant circuitry 118 either directly or through data inversion logic 122 to receive data values or complemented data values. Respective outputs of the registers 202, 204, and 206 can be coupled to the voting logic 124 either directly or through another instance of the data inversion logic 122 to provide data values or complemented data values to the voting logic 124, which can be configured as described herein (e.g., with reference to FIG. 3) to provide an output data value to a data output 228 of the complementary 2(N)-bit redundant circuitry 118.

Generally, the registers 202, 204, and 206 may be configurated to implement triple modular redundancy (TMR) with additional aspects or features of complementary 2(N)-bit redundant circuitry 118 for SEU prevention as described herein. For example, the one-bit R1 register 202 can be configured to store a complementary logic value of NOT (R1) or R1B. As shown, data i/p D and data o/p Q are inverted with data inversion logic 122 that includes external NOT gates 230 and 232, which provide no change in logic equivalence. The second register R2 204 can be implemented as a DUAL flip flop or 2-bit storage element for 2-bit redundancy, with a first flip flop or data storage element (e.g., first bit) configured to store an original data value or un-complemented data value (R2). A second flip flop or data storage element (e.g., second bit) is configured to store a complemented data value R2B. Here, the data i/p D and data o/p Q of the second data storage element of the second register R2 204 are inverted with data inversion logic 122 that includes external NOT gates 234 and 236, which provide no change in logic equivalence. The third register R3 is coupled to the data input 226 and can be configured to store an original data value or un-complemented data value (R3), similar to the first data storage element of register R2 204.

The voting logic 124 is coupled to respective outputs of the registers 202, 204, and 206 either directly or through the data inversion logic 122. Generally, the voting logic 124 may provide an adaptive or configurable majority voter function to generate an output data value based on various combinations of the respective data values and/or complementary data values stored by the registers 202, 204, and/or 206. The voting logic 124, the registers 202, 204, and/or 206, or other components can be implemented in various ways in accordance with aspects of complementary 2(N)-bit redundancy to prevent single event upset. In aspects, the voting logic 124 may include a majority voter function that can be tuned for a wide array of optimizations. For example, the majority voter function can calculate a majority from at least three register outputs, such as either R1B, R2, and R3; or R1B, R2B, and R3. As another example, the majority voter function could choose not to invert the R1B output, instead calculate a majority of R1, R2, and R3 (e.g., similar to a TMR configuration). As yet another example, the majority voter function can be implemented for programmable voting and/or perform cyclic voting. In other cases, the voting logic 124 may include XORs circuits that receive and evaluate complementary pairs (e.g., R1B/R2 or R2B/R3) to detect a remote or local register failure. By so doing, the voting logic 124 can detect whether R1 or one of the R2 stages failed and use another stage as a dummy replacement, thereby enabling the complementary 2(N)-bit redundant circuitry 118 to implement error detection and correction.

Figure 3:
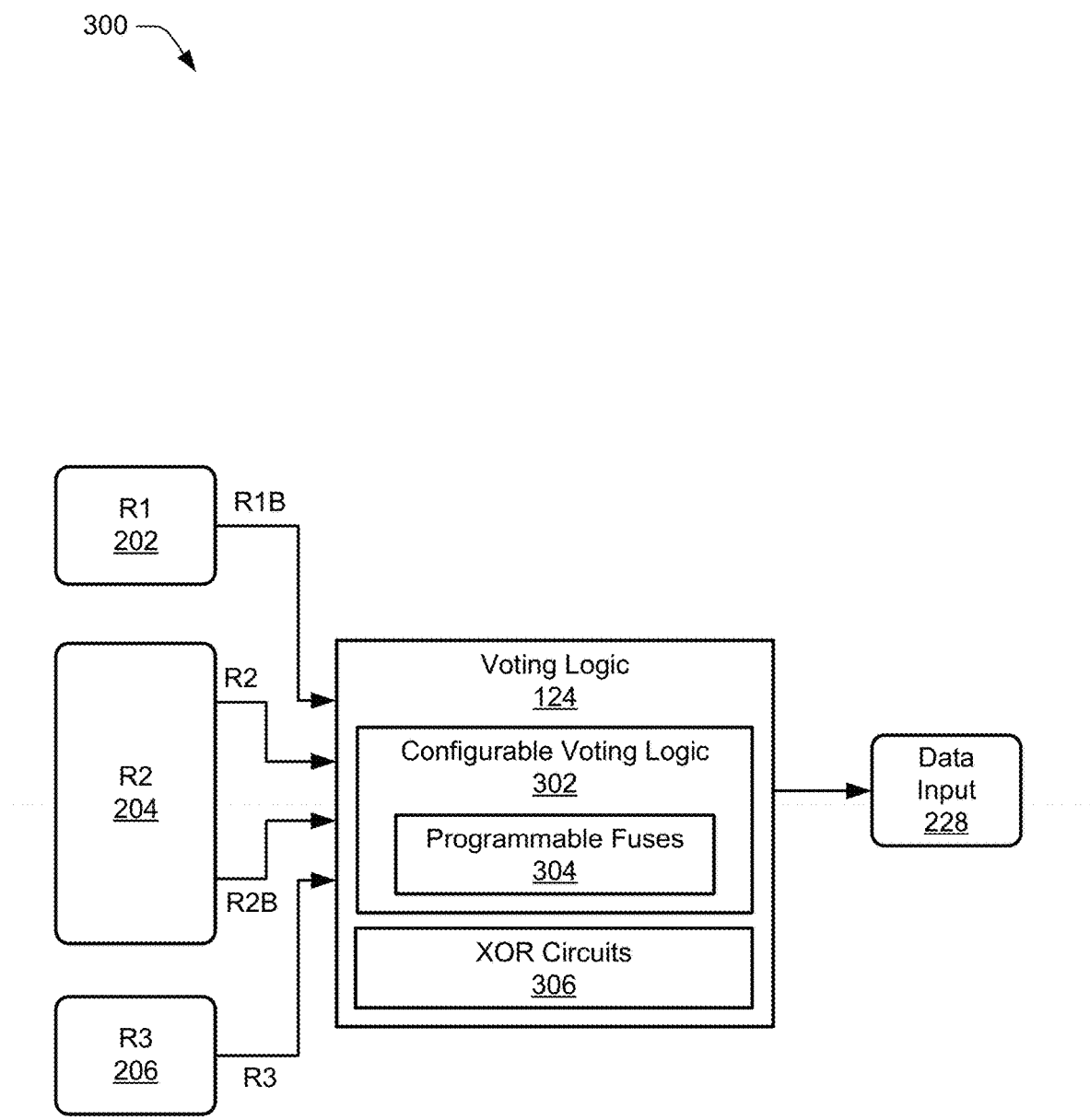
FIG. 3 illustrates an example configuration of voting logic with configurable logic for implementing one or more aspects of complementary 2(N)-bit redundancy.

In aspects, complementary 2(N)-bit redundant circuitry 118 may be configured to control or minimize replication of vulnerability due to a stored state by storing complementary logic states in the replicated registers or cells. As shown in FIG. 3, the value of voltage at R1 and R2 are different; consequently, node values are also different and have complementary vulnerability. In other words, an SEU is unlikely to occur at both replicated cells that results in both of voltages R1 and R2 changing states. Thus, a malicious actor is unlikely to be able to cause an SEU because an output of the circuit will not be affected unless the malicious actor is able to change the respective states of both R1 and R2 to their complementary states. As further illustrated in FIG. 3, majority voting logic is modified to allow correct voting functionality from one or more of the complementary logic paths (e.g., R1B and/or R2B). Multiple variants of the implementation are usable to trade off reliability over power, performance, and area (PPA) costs and overhead.

FIG. 3 illustrates at 300 an example configuration of voting logic 124 with configurable logic for implementing one or more aspects of complementary 2(N)-bit redundancy. As noted, the components and architecture of FIG. 3 are presented as a non-limiting example of ways in which complementary 2(N)-bit redundancy for SEU prevention can be implemented. As such, the aspects described herein may be applied or extended to any suitable data storage circuit to implement various features of complementary 2(N)-bit redundancy for SEU prevention. Various components described with reference to FIG. 3 may be implemented as separate hardware- or software-based modules, such as blocks or modules of data storage elements and configurable voting logic. As such, any of the structure or functionality described herein may be provided by or configurable (e.g., for different voting algorithms) through fuse programming and/or execution of instructions by a processor core of a data storage module.

As shown in FIG. 3, the voting logic may be implemented with configurable voting logic 302, which can include programmable fuses 304. Alternatively or additionally, the voting logic 124 includes or is associated with exclusive-OR (XOR) circuits 306 that are capable of receiving, monitoring, and/or evaluating complementary pairs (e.g., R1B/R2, R2B/R3) to detect a remote or local register failure. As described herein, the voting logic 124 may provide an adaptive or configurable majority voter function to generate an output data value based on various combinations of the respective data values R2, R3 and/or complementary data values R1B, R2B stored by and/or output from the registers 202, 204, and/or 206. The voting logic 124, configurable voting logic 302, and/or programmable fuses 304 can be implemented in various ways in accordance with aspects of complementary 2(N)-bit redundancy to prevent single event upset. In aspects, the voting logic 124 may include a majority voter function that can be tuned or altered via the configurable voting logic 302 for a wide array of optimizations. For example, the majority voter function can calculate a majority from at least three register outputs, such as either R1B, R2, and R3; or R1B, R2B, and R3. As another example, the majority voter function could choose not to invert the R1B output, instead calculate a majority of R1, R2, and R3 (e.g., similar to a TMR configuration). As yet another example, the majority voter function can be implemented for programmable voting and/or perform cyclic voting.

In aspects, the configurable voting logic 302 may be altered, set, or reconfigured at different life cycle stages of a chip or device in which the 2(N)-bit redundant circuitry 118 is implemented. For example, a chip designer may configure multiple instances of 2(N)-bit redundant circuitry 118 in a chip with different respective voting configurations to mitigate risks of attack by malicious actors. In other cases, a device manufacturer can set the configurable voting logic by burning the programmable fuses 304 to implement custom or scrambled voting logic that differs between manufactured devices. Alternatively or additionally, self-correcting implementations of 2(N)-bit redundant circuitry 118 may detect a failed register or data inversion component and reconfigure the configurable voting logic 302 (e.g., by burning additional fuses) to exclude the failed register from the majority voting function or voting algorithm. For example, the voting logic 124 may include XORs circuits that receive and evaluate complementary pairs (e.g., R1B/R2 or R2B/R3) to detect a remote or local register failure. By so doing, the voting logic 124 can detect whether R1 or one of the R2 stages failed and use another stage as a dummy replacement, thereby enabling the complementary 2(N)-bit redundant circuitry 118 to implement error detection and correction.

Example Methods

Example methods 400, 500, and 600 are described with reference to FIG. 4, FIG. 5, and FIG. 6, respectively, in accordance with one or more aspects of complementary 2(N)-bit redundancy for SEU prevention. Generally, the methods 400, 500, and 600 illustrate sets of operations (or acts) that may be performed in, but not necessarily limited to, the order or combinations in which the operations are shown herein. Further, any of one or more of the operations may be repeated, combined, reorganized, skipped, or linked to provide a wide array of additional and/or alternate methods. In portions of the following discussion, reference may be made to the environment 100 of FIG. 1, circuits, components, or configurations of FIG. 2 and/or FIG. 3, device or systems of FIG. 7 or FIG. 8, and/or entities detailed in FIG. 1 or other figures, reference to which is made for example only. The techniques and apparatuses described in this disclosure are not limited to an embodiment or performance by components or configuration of one circuit or those described with reference to the figures.

Figure 4:
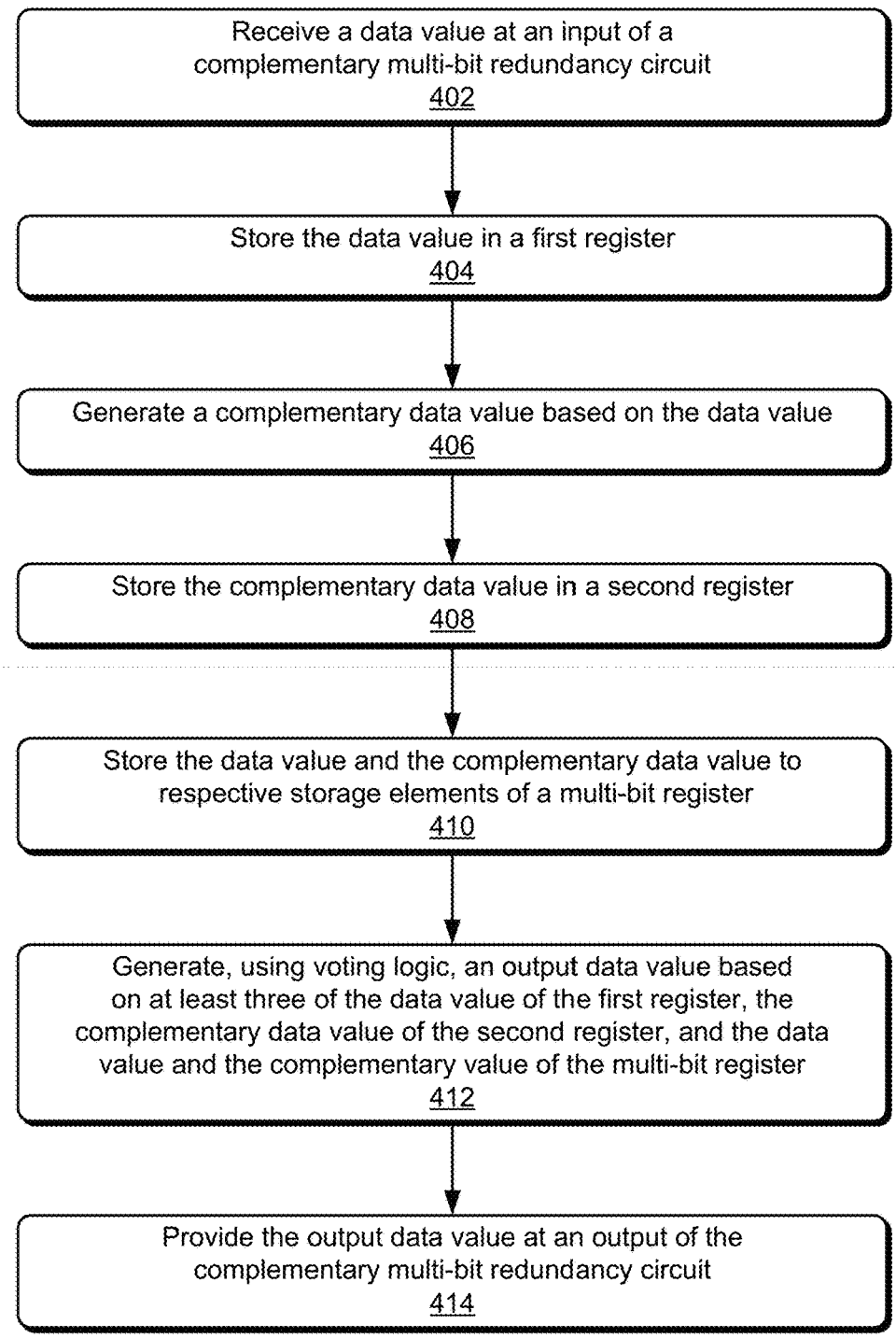
FIG. 4 illustrates an example method for operating a complementary 2(N)-bit redundancy circuit in accordance with one or more aspects.

FIG. 4 illustrates an example method 400 for operating a complementary 2(N)-bit redundancy circuit in accordance with one or more aspects. In some aspects, operations of the method 400 may be implemented to store a data value in a way that is protected from alteration by single upset events.

At 402, a data value is received at an input of a complementary multi-bit redundancy circuit. The data value may have a voltage or logic state that corresponds to a binary value of the data value, which may include either a zero (0)) or a one (1) value. In the context of the method 400, assume the data value received at an input node of the complementary multi-bit redundancy circuit is a 1 or logical high value.

At 404, the data value is stored to a first register of the complementary multi-bit redundancy circuit. For example, the data value (e.g., 1) is stored to a first one-bit register of the complementary multi-bit redundancy circuit.

At 406, a complementary data value is generated based on the data value. Generally, data inversion logic or a data inversion gate that is separate from or external to the data storage elements of the complementary multi-bit redundancy circuit provides a complemented or inverted data value that has a logical state opposite to that of the original or unmodified data value. Continuing the present example, the data inversion logic of the complementary multi-bit redundancy circuit provides a complemented data value of 0).

At 408, the complementary data value is stored in a second register of the complementary multi-bit redundancy circuit. For example, the complemented or inverted data value (e.g., 0) is stored to a second one-bit register of the complementary multi-bit redundancy circuit.

At 410, the data value and the complementary data value are stored to respective storage elements of a multi-bit register of the complementary multi-bit redundancy circuit. The respective storage elements (e.g., latches or dual interlocked cell (DICE) flops) of the complementary multi-bit redundancy circuit may be clocked or gated using same clocking or gating circuitry that is internal to the multi-bit register. In the context of the present example, the data value (e.g., 1) is stored to a first storage element of the multi-bit register and the complemented or inverted data value (e.g., 0) is stored to a second storage element of the multi-bit register to provide complementary multi-bit redundancy using the multi-bit or 2-bit register.

At 412, an output data value is generated using voting logic of the complementary multi-bit redundancy circuit based. As inputs, the voting logic uses at least three of the data value of the first register, the complementary data value of the second register, and the data value and the complementary value of the multi-bit register to generate the output data value. For example, the voting logic may provide the output data 1 value based on a majority from at least three register outputs, such as either R1B, R2, and R3; or R1B, R2B, and R3 as described herein. Concluding the present example, at 414, the output data value of 1 is provided at an output of the complementary multi-bit redundancy circuit based on the voting majority logic for R1B (0), R2 (1), and R3 (1).

FIG. 5 illustrates an example method 500 for error detection and/or correction that a complementary 2(N)-bit redundancy circuit can implement. In some aspects, operations of the method 500 may be implemented to detect and correct errors associated with a storage element of complementary 2(N)-bit redundant circuitry.

At 502, a complementary pair of a data value from a first register and a complementary data value from a second register are monitored. At 504, a failure of the first register or the second register is detected based on respective values of the data value and the complementary data value. For example, the complementary pair of the data value and the complementary value may be provided to an XOR circuit that generates an error when the respective values match, indicating that one of the registers has suffered a bit flip.

At 506, voting logic is altered to exclude the first register or the second register from voting criteria that are used to provide an output data value. Based on the detected error, the voting logic may determine, based on at least two other stored data values, which register provided an incorrect value and exclude the failed register from the voting algorithm to prevent propagation of the data error.

At 508, the voting logic is altered to include a data value or complementary data value from a third register in the voting criteria. In other words, the voting logic can be altered to introduce or add a previously unused register output as part of an error self-detection and correction scheme implemented by the complementary 2(N)-bit redundant circuitry. At 510, the output data value is generated using the altered voting logic based on at least one data value from the complementary pair and the data value or the complementary data value from the third register, such as to provide a corrected data value.

Figure 6:
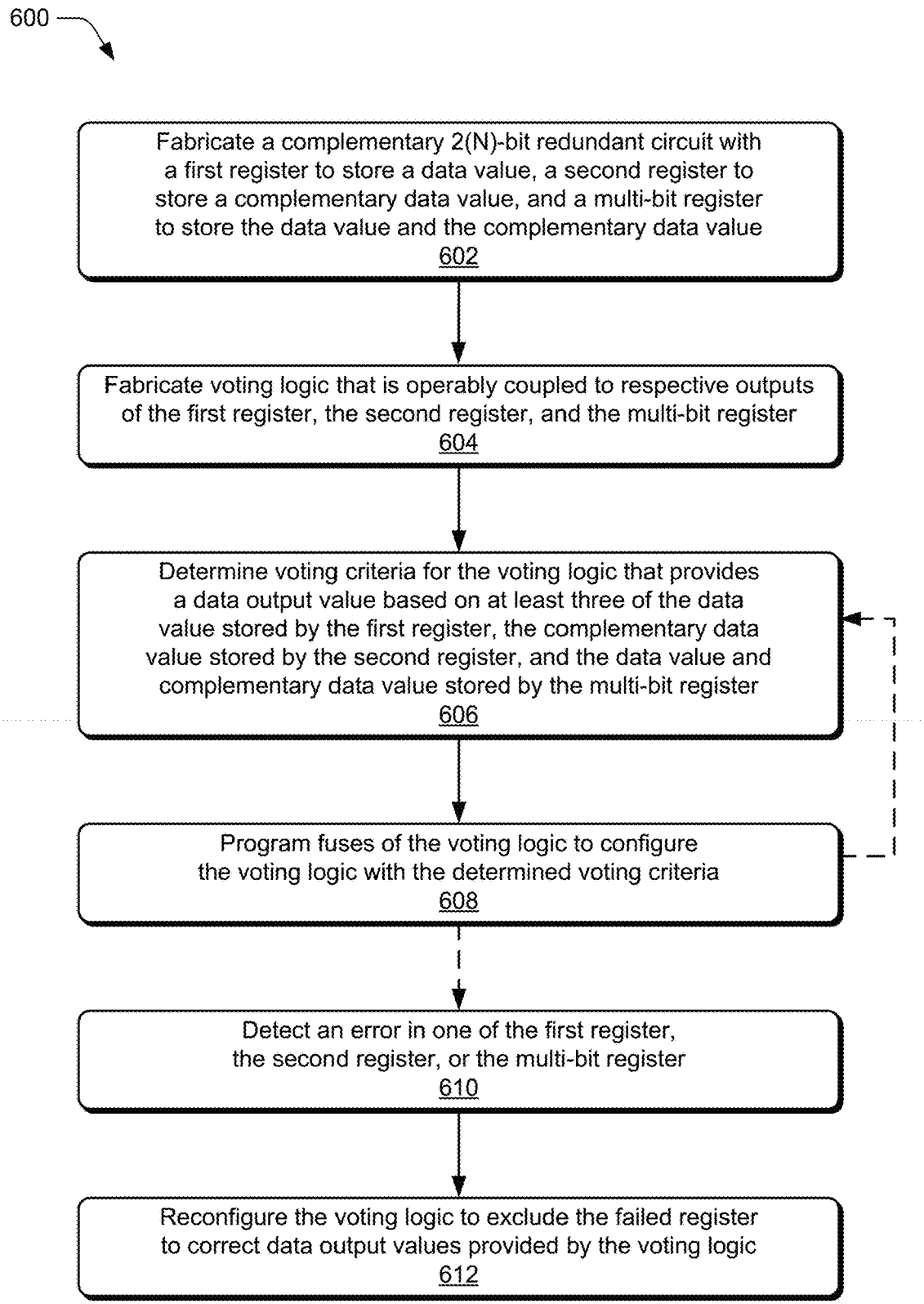
FIG. 6 illustrates an example method for fabricating and programming voting logic of a complementary 2(N)-bit redundancy circuit in accordance with various aspects.

FIG. 6 illustrates an example method 600 for fabricating and programming voting logic of a complementary 2(N)-bit redundancy circuit in accordance with various aspects. In some aspects, operations of the method 600 may be implemented to provide complementary 2(N)-bit redundant circuitry with various voting criteria or to address an error when detected in the complementary 2(N)-bit redundant circuitry. In some cases, the described fabrication of complementary 2(N)-bit redundancy and associated components may be biased towards the noise margin to "High"/"Low" logic values in a design/technology.

At 602, a complementary 2(N)-bit redundant circuit is fabricated with a first register to store a data value, a second register to store a complementary data value, and a multi-bit register to store the data value and the complementary data value.

At 604, voting logic is fabricated that is operably coupled to respective outputs of the first register, the second register, and the multi-bit register. The voting logic may be coupled directly to the outputs of the registers or coupled through other fabricated or added components, which may include data inversion logic or gates. In aspects, the complementary 2(N)-bit redundant circuit may be fabricated with or include the voting logic, such that operations 602 and 604 are performed together or concurrently to provide the complementary 2(N)-bit redundant circuit with voting logic. In aspects, the use of the multi-bit (Mbit)/2-bit registers as described may prevent attacks that are less precise than approximately 10-15 nanometers in a 5-7 nanometer node technology that would act to flip data incorrectly. Thus, for less precise attacks, both the original data value and the complemented data value would flip, negating any data value change caused by the bit flip. This may also provide options for designers to encode random voter functions, such as across a chip or in a different silicon area, to detect if the attack/flip was a local SEU or a global attack. In other words, the complementary storage assures that a global attack to flip the same bits needs to be very precise in determining which bits to flip or not to flip, effective to propagate any data error beyond the described circuit.

At 606, voting criteria is determined for the voting logic that provides a data output value based on at least three of the data value stored by the first register, the complementary data value stored by the second register, and the data value and complementary data value stored by the multi-bit register. At 608, fuses of the voting logic are programmed to configure the voting logic with the determined voting criteria.

From operation 608, the method 600 may return to a preceding operation (operation 606) to perform another iteration of one or more operations of the method 600 to provide additional complementary 2(N)-bit redundant circuits with same or different voting criteria. Alternatively, when the complementary 2(N)-bit redundant circuit begins operation, the method 600 may proceed to operation 610 to implement error detection and/or error correction.

At 610, an error is detected in one of the first register, the second register, or the multi-bit register based on the respective outputs of the registers. For example, the complementary pair of a data value and a complementary value from the registers may be provided to an XOR circuit that generates an error when the respective values match, indicating that one of the registers has suffered a bit flip.

At 612, the voting logic is reconfigured to exclude the failed register to correct data output values provided by the voting logic. Based on the detected register error, the voting logic may determine, based on at least two other stored data values, which register provided an incorrect value and exclude the failed register from the voting algorithm to prevent propagation of the data error. Alternatively or additionally, the voting logic can be altered to include a data value or complementary data value from a third register (e.g., previously unused) in the voting criteria. In other words, the voting logic can be altered to introduce or add a previously unused register output as part of an error self-detection and correction scheme implemented by the complementary 2(N)-bit redundant circuitry.

Example Devices and Systems

Figure 7:
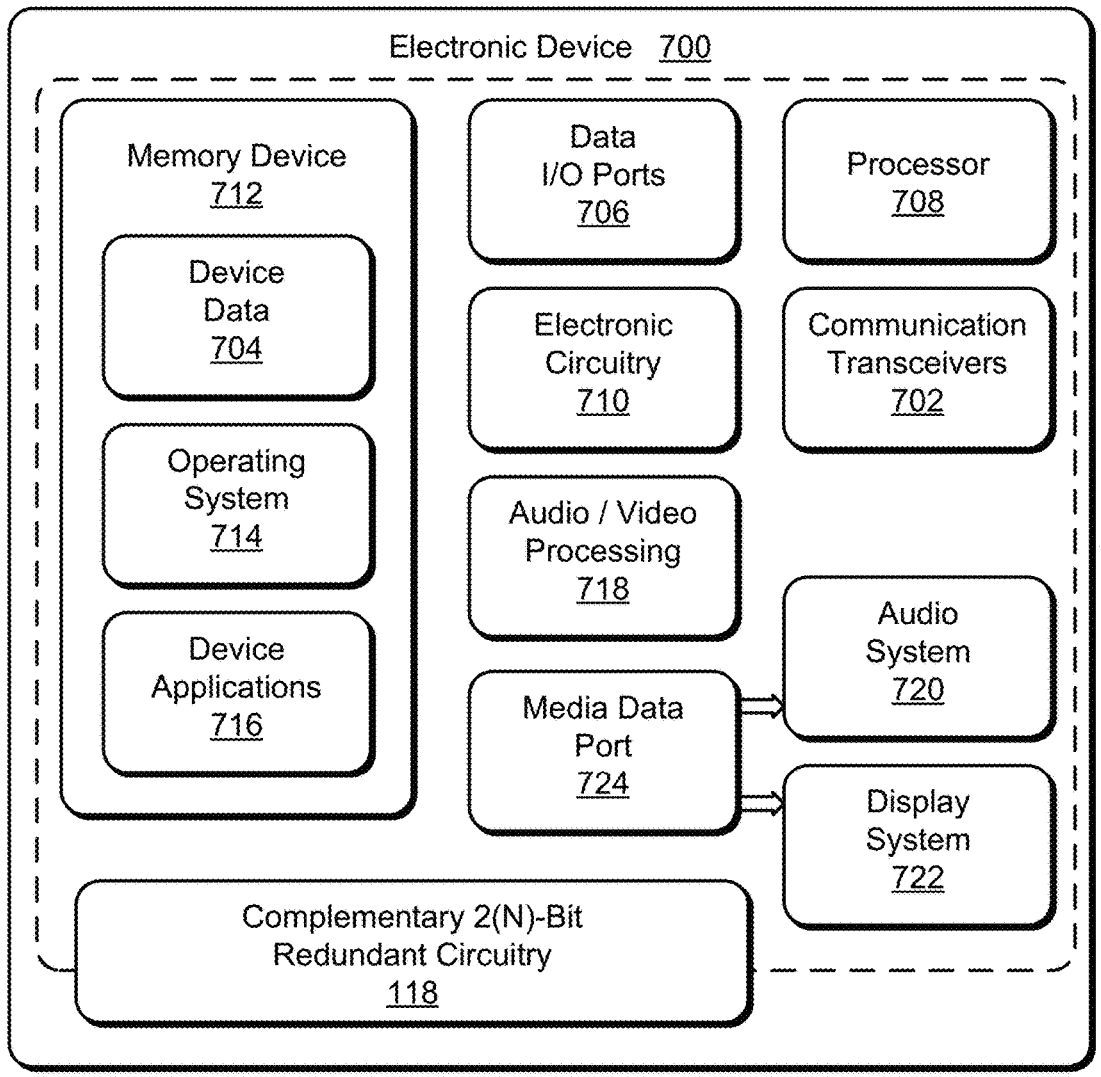
FIG. 7 illustrates an example electronic device in which aspects of complementary 2(N)-bit redundancy may be implemented.

FIG. 7 illustrates various components of an example electronic device 700 that can implement complementary 2(N)-bit redundancy for SEU prevention in accordance with one or more aspects as described with reference to any of the preceding FIGS. 1-6. The electronic device 700 may be implemented as any one or a combination of a fixed or mobile device, in any form of a consumer device, computing device, portable device, user device, user equipment, server, communication device, phone, navigation device, gaming device, media device, messaging device, media player, and/or other type of electronic device or a wirelessly-enabled device. For example, the electronic device 700 may be implemented as a smart-phone, phone-tablet (phablet), laptop computer, set-top box, wireless drone, computing-glasses, vehicle-based computing system, or wireless broadband router.

The electronic device 700 includes communication transceivers 702 that enable wired and/or wireless communication of device data 704, such as received data, transmitted data, or other information as described above. Example communication transceivers 702 include near-field communication (NFC) transceivers, WPAN radios compliant with various IEEE 802.15 standards, WLAN radios compliant with any of the various IEEE 802.11 standards, WWAN (3GPP-compliant) radios for cellular telephony, WMAN radios compliant with various IEEE 802.16 standards, and wired local area network (LAN) Ethernet transceivers.

The electronic device 700 may also include one or more data input/output ports 706 (data I/O ports 706) via which any type of data, media content, and/or other inputs can be received, such as user-selectable inputs, messages, applications, music, television content, recorded video content, and any other type of audio, video, and/or image data received from any content and/or data source. The data I/O ports 706 may include Universal Serial Bus (USB) ports, coaxial cable ports, and other serial or parallel connectors (including internal connectors) for flash memory, DVDs, CDs, and the like. These data I/O ports 706 may be used to couple the electronic device to components, peripherals, or accessories such as keyboards, microphones, or cameras.

The electronic device 700 of this example includes at least one processor 708 (e.g., one or more application processors, processor cores microprocessors, digital signal processors (DSPs), controllers, or the like), which can include a combined processor and memory system, that executes computer-executable instructions stored on computer-readable media to control operation or implement functionalities of the device. Generally, a processor or processing system may be implemented at least partially in hardware, which can include components of an integrated circuit or on-chip system, a DSP, an application-specific integrated circuit (ASIC), a field-programmable gate array (FPGA), a complex programmable logic device (CPLD), and other implementations in silicon and/or other hardware.

Alternatively or additionally, the electronic device 700 can be implemented with any one or combination of electronic circuitry 710, which may include hardware, fixed logic circuitry, or physical interconnects (e.g., traces or connectors) that are implemented in connection with processing and control circuits. This electronic circuitry 710 can implement executable or hardware-based modules (not shown) through logic circuitry and/or hardware, such as an FPGA or CPLD. Although not shown, the electronic device 700 may also include a system bus, interconnect fabric, crossbar, or data transfer system that couples the various components within the device. A system bus or interconnect fabric can include any one or combination of different bus structures or IP blocks, such as a memory bus, memory controller, a peripheral bus, a universal serial bus, interconnect nodes, and/or a processor or local bus that utilizes any of a variety of bus architectures.

The electronic device 700 also includes one or more memory devices 712 that enable data storage, examples of which include random access memory (RAM), non-volatile memory (e.g., read-only memory (ROM), flash memory. EPROM, and EEPROM), and a disk storage device. Any or all of the memory devices 712 may enable persistent and/or non-transitory storage of information, data, or code and thus do not include transitory signals or carrier waves in the general context of this disclosure. For example, the memory device(s) 712 provide data storage mechanisms to store the device data 704 and other types of data (e.g., user data). The memory device 712 may also store an operating system 714, firmware, and/or device applications 716 of the electronic device as instructions, code, or information. These instructions or code can be executed by the processor 708 to implement various functionalities of the electronic device, such as to provide a user interface, enable data access, or manage connectivity with a wireless network. In aspects, the memory device 712 also stores processor-executable code or instructions for providing functionalities related to complementary 2(N)-bit redundancy for SEU prevention, such as error detection, error correction, and/or voting logic configuration or reconfiguration, such as described with reference to FIGS. 1-6.

As shown in FIG. 7, the electronic device 700 may include an audio and/or video processing system 718 for processing audio data and/or passing through the audio and video data to an audio system 720 and/or to a display system 722 (e.g., a video buffer or device screen). The audio system 720 and/or the display system 722 may include any devices that process, display, and/or otherwise render audio, video, graphical, and/or image data. Display data and audio signals can be communicated to an audio component and/or to a display component via a radiofrequency (RF) link. S-video link. HDMI (high-definition multimedia interface). Display Port, composite video link, component video link. DVI (digital video interface), analog audio connection, or other similar communication link, such as media data port 724. In some implementations, the audio system 720 and/or the display system 722 are external or separate components of the electronic device 700. Alternately, the display system 722 can be an integrated component of the example electronic device 700, such as part of an integrated display with a touch interface.

In aspects, any of the components of the electronic device 700 may include or be implemented with complementary 2(N)-bit redundant circuitry 118, such as for SEU prevention and to prevent malicious actors from affecting data stored by the electronic device. Alternatively or additionally, the electronic device 700 may represent an example implementation of the computer devices 102 as described throughout the present disclosure. Thus, in some cases the processor 708 is an example of the processor 106 (not shown), and/or the memory device 712 is an example of the computer-readable storage media 108 (not shown) for storing various data, instructions, or code for implementing a diversity controller or other applications. As such, aspects of complementary 2(N)-bit redundancy for SEU prevention as described herein can be implemented by, or in conjunction with, the components or modules of electronic device 700 of FIG. 7.

Figure 8:
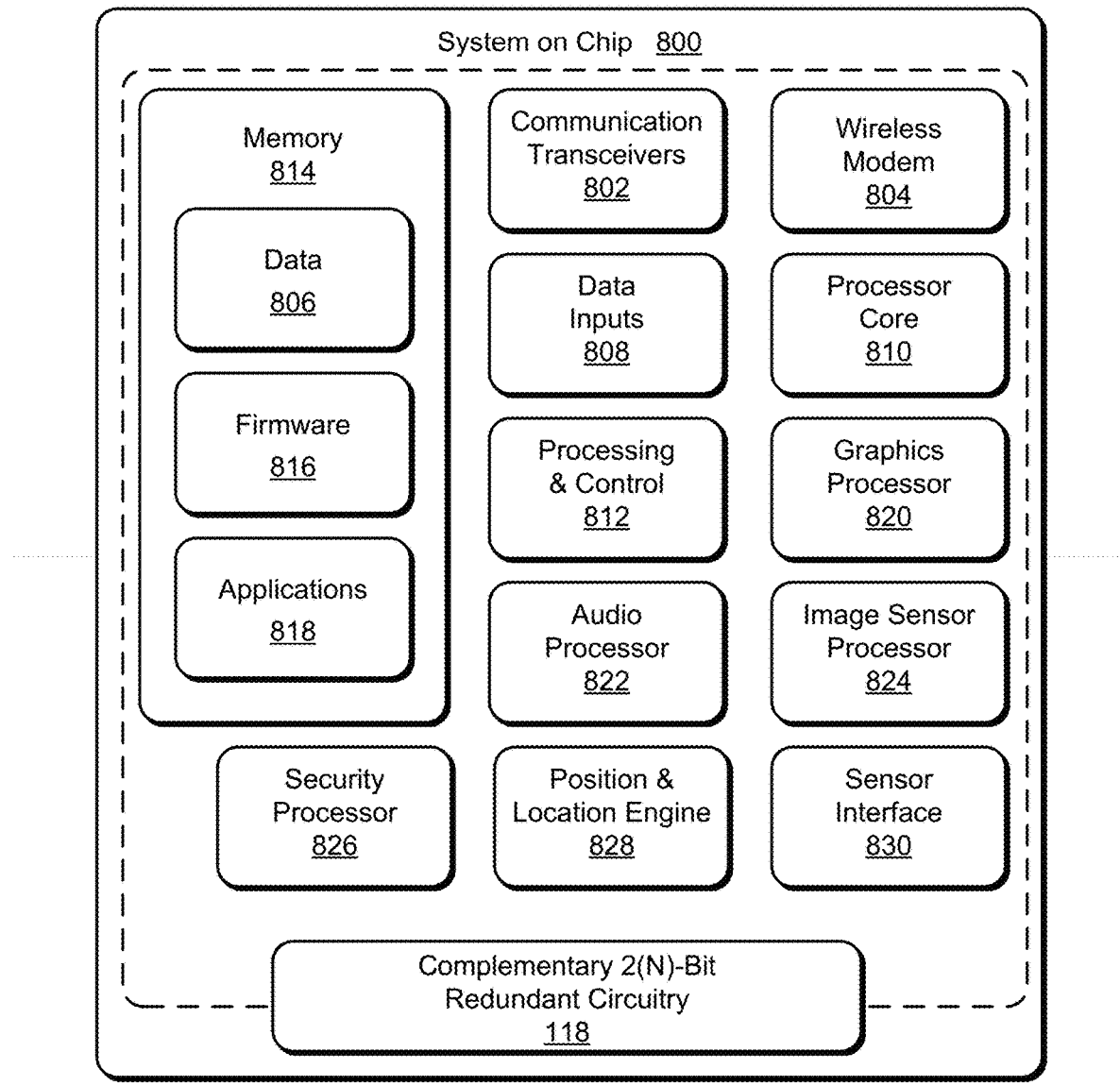
FIG. 8 illustrates an example system-on-chip (SoC) environment in which aspects of complementary 2(N)-bit redundancy circuitry may be implemented.

FIG. 8 illustrates an example system-on-chip (SoC) that may implement aspects of complementary 2(N)-bit redundancy for SEU prevention. The SoC 800 may be embodied as or within any type of computing device 102, user equipment, apparatus, other device, or system as described with reference to FIGS. 1-7 to implement complementary 2(N)-bit redundancy for SEU prevention. Although described with reference to chip-based packaging, the components shown in FIG. 8 may also be embodied as other systems or component configurations, such as, and without limitation, a Field-Programmable Gate Arrays (FPGA), an Application-Specific Integrated Circuits (ASIC), an Application-Specific Standard Products (ASSP), a digital signal processor (DSP). Complex Programmable Logic Devices (CPLD), system in package (SiP), package on package (POP), processing and communication chip set, communication co-processor, sensor co-processor, or the like.

In this example, the SoC 800 includes communication transceivers 802 and a wireless modem 804 that enable wired or wireless communication of data 806 (e.g., received data, data that is being received, data scheduled for broadcast, packetized, or the like). In some aspects, the wireless modem 804 is a multi-mode multi-band modem or baseband processor that is configurable to communicate in accordance with various communication protocols and/or in different frequency bands, such as those protocols or frequency bands described throughout this disclosure. The wireless modem 804 may include a transceiver interface (not shown) for communicating encoded or modulated signals with transceiver circuitry.

The data 806 or other system content can include configuration settings of the system or various components (e.g., voting functions or voting logic configurations), media content stored by the system, and/or information associated with a user of the system. Media content stored on the system-on-chip 800 may include any type of audio, video, and/or image data. The system-on-chip 800 also includes one or more data inputs 808 via which any type of data, media content, and/or inputs can be received, such as user input, user-selectable inputs (explicit or implicit), or any other type of audio, video, and/or image data received from a content and/or data source. Alternatively or additionally, the data inputs 808 may include various data interfaces, which can be implemented as any one or more of a serial and/or parallel interface, a wireless interface, a network interface, and as any other type of communication interface enabling communication with other devices or systems.

The system-on-chip 800 includes one or more processor cores 810, which process various computer-executable instructions to control the operation of the system-on-chip 800. Alternatively or additionally, the system-on-chip 800 can be implemented with any one or combination of hardware, firmware, or fixed logic circuitry that is implemented in connection with processing and control circuits, which are generally shown at 812. Although not shown, the system-on-chip 800 may also include a bus, interconnect, crossbar, or fabric that couples the various components within the system.

The system-on-chip 800 also includes a memory 814 (e.g., computer-readable media), such as one or more memory circuits that enable persistent and/or non-transitory data storage, and thus do not include transitory signals or carrier waves. Examples of the memory 814 include RAM, non-volatile memory (e.g., read-only memory (ROM). EPROM. EEPROM, etc.), or flash memory. The memory 814 provides data storage for the system data 806, as well as for firmware 816, applications 818, and any other types of information and/or data related to operational aspects of the system-on-chip 800. For example, the firmware 816 can be maintained as processor-executable instructions of an operating system (e.g., real-time OS) within the memory 814 and executed on one or more of the processor cores 810.

The applications 818 may include a system manager, such as any form of a control application, software application, signal-processing and control module, code that is native to a particular system, an abstraction module or gesture module, and so on. The memory 814 may also store system components or utilities for implementing aspects of complementary 2(N)-bit redundancy for SEU prevention, which may include voting algorithms and/or voting configurations for the voting logic. These entities may be embodied as combined or separate components, examples of which are described with reference to corresponding entities or functionality as illustrated in FIGS. 1-7.

In some aspects, the system-on-chip 800 also includes additional processors or co-processors to enable other functionalities, such as a graphics processor 820, audio processor 822, and image sensor processor 824. The graphics processor 820 may render graphical content associated with a user interface, operating system, or applications of the system-on-chip 800. In some cases, the audio processor 822 encodes or decodes audio data and signals, such as audio signals and information associated with voice calls or encoded audio data for playback. The image sensor processor 824 may be coupled to an image sensor and provide image data processing, video capture, and other visual media conditioning and processing functions.

The system-on-chip 800 may also include a security processor 826 to support various security, encryption, and cryptographic operations, such as to provide secure communication protocols and encrypted data storage. Although not shown, the security processor 826 may include one or more cryptographic engines, cipher libraries, hashing modules, or random number generators to support encryption and cryptographic processing of information or communications of the system-on-chip 800 (SoC 800). Alternatively or additionally, the system-on-chip 800 can include a position and location engine 828 and a sensor interface 830. Generally, the position and location engine 828 may provide positioning or location data by processing signals of a Global Navigation Satellite System (GNSS) and/or other motion or inertia sensor data (e.g., dead-reckoning navigation). The sensor interface 830 enables the system-on-chip 800 to receive data from various sensors, such as capacitance and motion sensors. In some aspects, any of the components or functional blocks of the SoC 800 may include or be implemented with complementary 2(N)-bit redundant circuitry 118, such as for SEU prevention and to prevent malicious actors from affecting data stored by the electronic device.

Variations

Although the above-described apparatuses and methods are described in the context of complementary 2(N)-bit redundancy for SEU prevention in a wireless network in which one or more base stations are accessible, the described devices, systems, and methods are non-limiting and may apply to other contexts, user equipment deployments, or wireless-communication environments.

Generally, the components, modules, methods, and operations described herein can be implemented using software, firmware, hardware (e.g., fixed logic circuitry), manual processing, or any combination thereof. Some operations of the example methods may be described in the general context of executable instructions stored on computer-readable storage memory that is local and/or remote to a computer processing system, and implementations can include software applications, programs, functions, and the like. Alternatively, or in addition, any of the functionality described herein can be performed, at least in part, by one or more hardware logic components, such as, and without limitation, FPGAs, ASICs, ASSPs, SoCs, CPLDs, co-processors, context hubs, motion co-processors, sensor co-processors, or the like.

In the following, some examples are described:

Example 1: An integrated circuit comprising: an input node to receive a data value; a first register having an input operably coupled to the input node, the first register configured to store the data value; at least one inverter operably coupled to the input node to provide a complementary data value; a second register having an input operably coupled to the at least one inverter, the second register configured to store the complementary data value; a multi-bit register having a first input operably coupled to the input node and a second input operably coupled to the at least one inverter, the multi-bit register configured to store the data value and the complementary data value as separate values; and voter logic comprising: an output coupled to an output node of the integrated circuit; a first input operably coupled to an output of the first register to receive a first logic value based on the data value stored by the first register; a second input operably coupled to an output of the second register to receive a second logic value based on the complementary data value stored by the second register; a third input coupled to a first output of the multi-bit register to receive a third logic value based on the data value stored by the multi-bit register; and a fourth input coupled to a second output of the multi-bit register to receive a fourth logic value based on the complementary data value stored by the multi-bit register, the voter logic configured to provide an output data value to the output node of the integrated circuit based on a set of respective logic values of at least three of the first logic value, second logic value, third logic value, and the fourth logic value.

Example 2: The integrated circuit as recited by example 1, wherein the at least one inverter operably coupled to the input node comprises: a first inverter operably coupled between the input node and the input of the second register; and a second inverter operably coupled between the input node and the second input of the multi-bit register.

Example 3: The integrated circuit as recited by example 1, wherein the at least one inverter operably coupled to the input node comprises a first inverter, and the integrated circuit further comprises at least one of: a second inverter operably coupled between the output of the second register and the second input of the voting logic; or a third inverter operably coupled between the second output of the multi-bit register and the fourth input of the voting logic.

Example 4: The integrated circuit as recited by example 3, wherein at least one of the first inverter, the second inverter, and the third inverter comprises an inverting logic gate that is implemented external to the first register, the second register, and the multi-bit register.

Example 5: The integrated circuit as recited by any of examples 1 to 4, wherein the multi-bit register further comprises: a first latch circuit configured to store the data value; a second latch circuit configured to store the complementary data value; and shared clock logic that is operably coupled to the first latch circuit and the second latch circuit.

Example 6: The integrated circuit as recited by example 5, wherein: the first latch circuit comprises at least one of a first flip-flop or first 1-bit storage element of the multi-bit register; and the second latch circuit comprises at least one of a second flip-flop or a second 1-bit storage element of the multi-bit register.

Example 7: The integrated circuit as recited by any of examples 1 to 6, wherein: the voting logic is configured to provide the output data value using a majority voting function based on the first logic value based on the data value stored by the first register; the second logic value based on the complementary data value stored by the second register; and the third logic value based on the data value stored by the multi-bit register.

Example 8: The integrated circuit as recited by any of examples 1 to 6, the voting logic is configured to provide the output data value using a majority voting function based on the first logic value based on the data value stored by the first register; the second logic value based on the complementary data value stored by the second register; and the fourth logic value based on the complementary data value stored by the multi-bit register.

Example 9: The integrated circuit as recited by any of examples 1 to 6, wherein the voting logic is configured to provide the output data value using a majority voting function based on the first logic value based on the data value stored by the first register; the second logic value based on a non-inverted version of the complementary data value stored by the second register; and the third logic value based on the data value stored by the multi-bit register.

Example 10: The integrated circuit as recited by any of examples 1 to 9, wherein: the set of respective logic values based on which the voting logic provides the output data value are a first set of respective logic values; and the voting logic is further configured to: detect a single event upset (SEU) based on the at least three of the first logic value, the second logic value, the third logic value, and the fourth logic value; and alter, in response to detection of the SEU, configurable logic of the voting logic to use a second set of respective logic values of at least three of the first logic value, second logic value, third logic value, and the fourth logic value to provide the output data value, the first set of respective logic values being different from the second set of respective logic values.

Example 11: The integrated circuit as recited by example 10, wherein the voting logic further comprises respective exclusive-OR circuits of complementary pairs of the first logic value, second logic value, third logic value, and the fourth logic value configured to detect the SEU.

Example 12: The integrated circuit as recited by example 10 or 11, wherein the voting logic is further configured to alter, in response to detection of the SEU, the configurable logic of the voting logic to implement a triple module redundancy (TMR) mode in which the voting logic implements a voting function based on: the first logic value based on the data value stored by the first register; the second logic value based on a non-inverted version of the complementary data value stored by the second register; and the third logic value based on the data value stored by the multi-bit register.

Example 13: A method performed by the integrated circuit of any one of examples 1 to 12 for storing data in a complementary multi-bit redundant circuit, the method comprising: receiving a data value at an input of the complementary multi-bit redundant circuit; storing the data value to a first one-bit register of the complementary multi-bit redundant circuit; generating, via data inversion circuitry, a complementary data value based on the data value, the complementary data value having a logic state opposite to a logic state of the data value; storing, from the data inversion circuitry, the complementary data value to a second one-bit register of the complementary multi-bit redundant circuit; storing the data value to a first storage element of a multi-bit register of the complementary multi-bit redundant circuit; storing, from the data inversion circuitry, the complementary data value to a second storage element of the multi-bit register of the complementary multi-bit redundant circuit; and generating, using voting logic of the complementary multi-bit redundant circuit, an output data value based on at least three of the data value stored by the first one-bit register, the complementary data value stored by the second one-bit register, the data value stored to the first storage element of the multi-bit register, and the complementary data value stored to the second storage element of the multi-bit register.

Example 14: The method as recited by example 13, further comprising: monitoring a complementary data value pair that includes one of the data values stored by the first one-bit register or the first storage element of the multi-bit register and one of the complementary data values stored by the second one-bit register and the second storage element of the multi-bit register; detecting, based on the complementary data value pair, a failure of one of the first one-bit register, the second one-bit register, the first storage element of the multi-bit register, or the second storage element of the multi-bit register; and altering the voting logic to exclude the failed one-bit register or storage element of the multi-bit register.

Example 15: The method as recited by example 14, wherein: the respective data value or complementary data value of one of the first one-bit register, the second one-bit register, the first storage element of the multi-bit register, or the second storage element of the multi-bit register is not used by the voting logic to provide the output data value, and the method further comprises: altering the voting logic to include the respective data value or complementary data value of the first one-bit register, the second one-bit register, the first storage element of the multi-bit register, or the second storage element of the multi-bit register that was not previously used by the voting logic to provide the output data value.

What is claimed is:

1. An integrated circuit comprising:
an input node to receive a data value;
a first data storage element having an input operably coupled to the input node, the first data storage element configured to store the data value;
at least one inverter operably coupled to the input node to provide a complementary data value;
a second data storage element having an input operably coupled to the at least one inverter, the second data storage element configured to store the complementary data value;
a multi-bit data storage element having a first input operably coupled to the input node and a second input operably coupled to the at least one inverter, the multi-bit data storage element configured to store the data value and the complementary data value as separate values; and
voter logic comprising:
an output coupled to an output node of the integrated circuit;
a first input of the voter logic operably coupled to an output of the first data storage element to receive a first logic value based on the data value stored by the first data storage element;
a second input of the voter logic operably coupled to an output of the second data storage element to receive a second logic value based on the complementary data value stored by the second data storage element;
a third input of the voter logic coupled to a first output of the multi-bit data storage element to receive a third logic value based on the data value stored by the multi-bit data storage element; and
a fourth input of the voter logic coupled to a second output of the multi-bit data storage element to receive a fourth logic value based on the complementary data value stored by the multi-bit data storage element,
the voter logic configured to provide an output data value to the output node of the integrated circuit based on a set of respective logic values of at least three of the first logic value, second logic value, third logic value, and the fourth logic value.

2. The integrated circuit as recited by claim 1, wherein the at least one inverter operably coupled to the input node comprises:
a first inverter operably coupled between the input node and the input of the second data storage element; and
a second inverter operably coupled between the input node and the second input of the multi-bit data storage element.

3. The integrated circuit as recited by claim 1, wherein the at least one inverter operably coupled to the input node comprises a first inverter, and the integrated circuit further comprises at least one of:

a second inverter operably coupled between the output of the second data storage element and the second input of the voting logic; or
a third inverter operably coupled between the second output of the multi-bit data storage element and the fourth input of the voting logic.

4. The integrated circuit as recited by claim 3, wherein at least one of the first inverter, the second inverter, or the third inverter comprises an inverting logic gate that is implemented external to the first data storage element, the second data storage element, and the multi-bit data storage element.

5. The integrated circuit as recited by claim 1, wherein the multi-bit data storage element further comprises:
a first latch circuit configured to store the data value;
a second latch circuit configured to store the complementary data value; and
shared clock logic that is operably coupled to the first latch circuit and the second latch circuit.

6. The integrated circuit as recited by claim 5, wherein:
the first latch circuit comprises at least one of first flip-flop or first 1-bit storage element of the multi-bit data storage element;
the second latch circuit comprises at least one of second flip-flop or a second 1-bit storage element of the multi-bit data storage element.

7. The integrated circuit as recited by claim 1, wherein:
the voting logic is configured to provide the output data value using a majority voting function based on:
the first logic value based on the data value stored by the first data storage element;
the second logic value based on the complementary data value stored by the second data storage element; and
the third logic value based on the data value stored by the multi-bit data storage element; or
the voting logic is configured to provide the output data value using a majority voting function based on:
the first logic value based on the data value stored by the first data storage element;
the second logic value based on the complementary data value stored by the second data storage element; and
the fourth logic value based on the complementary data value stored by the multi-bit data storage element.

8. The integrated circuit as recited by claim 1, wherein:
the voting logic is configured to provide the output data value using a majority voting function based on:
the first logic value based on the data value stored by the first data storage element;
the second logic value based on a non-inverted version of the complementary data value stored by the second data storage element; and
the third logic value based on the data value stored by the multi-bit data storage element.

9. The integrated circuit as recited by claim 1, wherein:
the set of respective logic values based on which the voting logic provides the output data value are a first set of respective logic values; and
the voting logic is further configured to:
detect a single event upset (SEU) based on the at least three of the first logic value, the second logic value, the third logic value, and the fourth logic value; and
alter, in response to detection of the SEU, configurable logic of the voting logic to use a second set of respective logic values of at least three of the first logic value, second logic value, third logic value, and the fourth logic value to provide the output data value, the first set of respective logic values being different from the second set of respective logic values.

10. The integrated circuit as recited by claim 1, wherein: the voting logic further comprises respective exclusive-OR circuits of complementary pairs of the first logic value, second logic value, third logic value, and the fourth logic value configured to detect the SEU.

11. The integrated circuit as recited by claim 10, wherein: the voting logic is further configured to alter, in response to detection of the SEU, the configurable logic of the voting logic to implement a triple module redundancy (TMR) mode in which the voting logic implements a voting function based on:
the first logic value based on the data value stored by the first data storage element;
the second logic value based on a non-inverted version of the complementary data value stored by the second data storage element; and
the third logic value based on the data value stored by the multi-bit data storage element.

12. The integrated circuit as recited by claim 1, wherein the first data storage element, the second data storage element, or the multi-bit data storage element are implemented as one or more of:
a latch, a bi-stable latch, a set-reset latch (SR latch), a master-slave latch, a D latch, a flip-flop, a D flip-flop, a T-flip-flop, a JK flip-flop, a master-slave flip-flop, a one-bit register, a multi-bit register, a logic storage unit, a charge storage unit, or a clocked data storage circuit.

13. A method performed by an integrated circuit, the method comprising:
receiving a data value at an input of the integrated circuit;
storing the data value to a first one-bit data storage element of the integrated circuit;
generating, via data inversion circuitry of the integrated circuit, a complementary data value based on the data value, the complementary data value having a logic state opposite to a logic state of the data value;
storing, from the data inversion circuitry, the complementary data value to a second one-bit data storage element of the integrated circuit;
storing the data value to a first storage element of a multi-bit data storage element of the integrated circuit;
storing, from the data inversion circuitry, the complementary data value to a second storage element of the multi-bit data storage element of the integrated circuit; and
generating, using voting logic of the integrated circuit, an output data value based on at least three of the data value stored by the first one-bit data storage element, the complementary data value stored by the second one-bit data storage element, the data value stored to the first storage element of the multi-bit data storage element, and the complementary data value stored to the second storage element of the multi-bit data storage element.

14. The method as recited by claim 13, the method comprising:
monitoring a complementary data value pair that includes one of the data values stored by the first one-bit data storage element or the first storage element of the multi-bit data storage element and one of the complementary data values stored by the second one-bit data storage element and the second storage element of the multi-bit data storage element;
detecting, based on the complementary data value pair, a failure of one of the first one-bit data storage element, the second one-bit data storage element, the first storage element of the multi-bit data storage element, or the second storage element of the multi-bit data storage element; and
altering the voting logic to exclude the failed one-bit data storage element or storage element of the multi-bit data storage element.

15. The method as recited by claim 14, wherein the respective data value or complementary data value of one of the first one-bit data storage element, the second one-bit data storage element, the first storage element of the multi-bit data storage element, or the second storage element of the multi-bit data storage element is not used by the voting logic to provide the output data value, and the method further comprises:
altering the voting logic to include the respective data value or complementary data value of the first one-bit data storage element, the second one-bit data storage element, the first storage element of the multi-bit data storage element, or the second storage element of the multi-bit data storage element that was not previously used by the voting logic to provide the output data value.

16. The method as recited by claim 13, wherein:
the generating the complementary data value comprises:
generating, via a first inverter of the data inversion circuitry, a first instance of the complementary data value;
generating, via a second inverter of the data inversion circuitry, a second instance of the complementary data value; and
the storing of the complementary data value comprises:
storing, from the first inverter, the first instance of the complementary value to the second one-bit data storage element; and
storing, from the second inverter, the second instance of the complementary value to the second storage element of the multi-bit data storage element.

17. The method as recited by claim 13, further comprising:
providing the data value stored by the first one-bit data storage element to a first input of the voting logic;
providing the complementary data value stored by the second one-bit data storage element to a second input of the voting logic;
providing the data value stored to the first storage element of the multi-bit data storage element to a third input of the voting logic; and
providing the complementary data value stored to the second storage element of the multi-bit data storage element to a fourth input of the voting logic.

18. The method of claim 17, further comprising:
providing, via a first inverter, the complementary data value stored in the second one-bit data storage element to the second input of the voting logic; or
providing, via second inverter, the complementary value stored in the second storage element of the multi-bit data storage element to the fourth input of the voting logic.

19. The method as recited by claim 17, wherein at least one of the data inversion circuitry, first inverter, or the second inverter comprises an inverting logic gate that is implemented external to the first one-bit data storage element, the second one-bit data storage element, and the multi-bit data storage element.

20. The method as recited by claim 13, further comprising clocking clock logic that is coupled to a first latch circuit of the multi-bit data storage element and a second latch circuit of the multi-bit data storage element, the clocking of the clock logic causing:
- the first latch circuit of the multi-bit data storage element to store the data value to the first storage element of the multi-bit data storage element; and
- the second latch circuit of the multi-bit data storage element to store the complementary data value to the second storage element of the multi-bit storage element.

* * * * *